(12) United States Patent
Yang

(10) Patent No.: US 12,718,890 B2
(45) Date of Patent: Aug. 25, 2026

(54) METHOD FOR ACCESSING FLASH MEMORY MODULE AND ASSOCIATED FLASH MEMORY CONTROLLER AND MEMORY DEVICE

(71) Applicant: Silicon Motion, Inc., Hsinchu County (TW)

(72) Inventor: Tsung-Chieh Yang, Hsinchu City (TW)

(73) Assignee: Silicon Motion, Inc., Hsinchu County (TW)

( * ) Notice: Subject to any disclaimer, the term of this patent is extended or adjusted under 35 U.S.C. 154(b) by 175 days.

(21) Appl. No.: 18/810,484

(22) Filed: Aug. 20, 2024

(65) Prior Publication Data

US 2025/0078936 A1 Mar. 6, 2025

Related U.S. Application Data

(60) Provisional application No. 63/536,055, filed on Aug. 31, 2023.

(30) Foreign Application Priority Data

Aug. 1, 2024 (TW) ................................ 113128756

(51) Int. Cl.
*G11C 16/26* (2006.01)
*G11C 16/34* (2006.01)

(52) U.S. Cl.
CPC .......... *G11C 16/26* (2013.01); *G11C 16/3404* (2013.01)

(58) Field of Classification Search
CPC ............................ G11C 16/26; G11C 16/3404
USPC .................................................. 365/189.011
See application file for complete search history.

(56) References Cited

U.S. PATENT DOCUMENTS

| | | | |
|---|---|---|---|
| 8,572,465 | B2 | 10/2013 | Uchikawa |
| 8,739,000 | B2 | 5/2014 | Ryan |
| 9,898,363 | B2 | 2/2018 | Kim |
| 10,176,041 | B2 | 1/2019 | Wu |

(Continued)

FOREIGN PATENT DOCUMENTS

| | | | |
|---|---|---|---|
| CN | 103544073 | A | 1/2014 |
| CN | 107452421 | A | 12/2017 |

(Continued)

*Primary Examiner* — Alexander Sofocleous
*Assistant Examiner* — Duy H Luong
(74) *Attorney, Agent, or Firm* — Winston Hsu

(57) ABSTRACT

The present invention provides a method for accessing a flash memory module, wherein the method includes the steps of: using a first set of threshold voltages, a positively adjusted first set of threshold voltages and a negatively adjusted first set of threshold voltages to read the first logical page to obtain first readout information, second readout information and third readout information, respectively; selecting a second logical page of the physical page; using a second set of threshold voltage to read the second logical page to generate fourth readout information; adjusting the first set of threshold voltages to generate an adjusted first set of threshold voltages according to the first readout information, the second readout information, the third readout information and the fourth readout information; and using the adjusted first set of threshold voltages to read the first logical page of the flash memory module.

15 Claims, 7 Drawing Sheets

(56) References Cited

U.S. PATENT DOCUMENTS

| | | | | |
|---|---|---|---|---|
| 2006/0274577 | A1 | 12/2006 | Pascucci | |
| 2012/0144267 | A1* | 6/2012 | Yeh | G11C 11/5642 714/763 |
| 2013/0215678 | A1* | 8/2013 | Yang | G06F 11/1048 365/185.03 |
| 2014/0026018 | A1 | 1/2014 | Yang | |
| 2014/0029336 | A1* | 1/2014 | Venkitachalam | G11C 16/06 365/185.09 |
| 2017/0168894 | A1 | 6/2017 | Kim | |
| 2017/0294217 | A1 | 10/2017 | Lin | |
| 2018/0012663 | A1 | 1/2018 | Alhussien | |
| 2019/0081641 | A1 | 3/2019 | Symons | |
| 2019/0384671 | A1 | 12/2019 | Chen | |
| 2020/0057572 | A1 | 2/2020 | Lin | |
| 2020/0057693 | A1 | 2/2020 | Kim | |
| 2020/0066354 | A1* | 2/2020 | Ioannou | G11C 16/26 |
| 2020/0319964 | A1 | 10/2020 | Kim | |
| 2020/0373944 | A1 | 11/2020 | Cho | |
| 2021/0306003 | A1 | 9/2021 | Kim | |
| 2023/0035079 | A1 | 2/2023 | Han | |
| 2025/0377794 | A1 | 12/2025 | Shikata | |

FOREIGN PATENT DOCUMENTS

| | | | |
|---|---|---|---|
| TW | I466123 | B | 12/2014 |
| TW | I612527 | B | 1/2018 |
| TW | I804359 | B | 6/2023 |

* cited by examiner

METHOD FOR ACCESSING FLASH MEMORY MODULE AND ASSOCIATED FLASH MEMORY CONTROLLER AND MEMORY DEVICE

CROSS REFERENCE TO RELATED APPLICATIONS

This application claims the benefit of U.S. Provisional Application No. 63/536,055, filed on Aug. 31, 2023. The content of the application is incorporated herein by reference.

BACKGROUND OF THE INVENTION

1. Field of the Invention

The present invention relates to a flash memory controller.

2. Description of the Prior Art

Flash memory can be electrically erased and programmed for data storage. It is widely used in memory cards, solid-state drives, portable multimedia players, etc. As the flash memory is a non-volatile memory, no power is needed to maintain the information stored in the flash memory. Besides, the flash memory offers fast read access and better shock resistance. These characteristics explain the popularity of the flash memory.

The flash memories may be categorized into NOR-type flash memories and NAND-type flash memories. Regarding the NAND flash memory, it has reduced erasing and programming time and requires less chip area per cell, thus allowing greater storage density and lower cost per bit than the NOR flash memory. In general, the flash memory stores data in an array of memory cells made from floating-gate transistors. Each memory cell can store one bit of information or more than one bit of information by adequately controlling the number of electrical charge on its floating gate to configure the threshold voltage required for turning on the memory cell made of a floating-gate transistor. In this way, when one or more predetermined control gate voltages are applied to a control gate of the floating-gate transistor, the conductive status of the floating-gate transistor would indicate the binary digit(s) stored by the floating-gate transistor.

However, due to certain factors, the number of electrical charge originally stored on one flash memory cell may be affected/disturbed. For example, the interference presented in the flash memory may be originated from write (program) disturbance, read disturbance, and/or retention disturbance. Taking a NAND flash memory including memory cells each storing more than one bit of information for example, one physical page includes multiple logical pages, and each of the logical pages is read by using one or more control gate voltages. For instance, regarding one flash memory cell which is configured to store four bits of information, the flash memory cell may have one of sixteen possible states (i.e., electrical charge levels) corresponding to different electrical charge amounts (i.e., different threshold voltages), respectively. However, due to the increase of the program/erase (P/E) count and/or the retention time, the threshold voltage distribution of memory cells in the flash memory may be changed. Thus, using original control gate voltage setting (i.e., threshold voltage setting) to read the stored bits from the memory cell may fail to obtain the correct stored information due to the changed threshold voltage distribution.

In addition, US patent application U.S. Pat. No. 8,760,929 proposes a threshold voltage tracking method to adjust the control gate voltage setting. However, this method cannot be effectively used for memory cells that store four bits of information.

SUMMARY OF THE INVENTION

Therefore, one of the objects of the present invention is to provide a flash memory controller and related control method, which can effectively adjust the control gate voltage setting (threshold voltage setting), to solve the above problems.

According to one embodiment of the present invention, a method for accessing a flash memory module comprises the steps of: using a first set of threshold voltages to read a first logical page of a physical page to generate readout information; decoding the readout information, and if the readout information is unable to be successfully decoded, using the first set of threshold voltages, a positively adjusted first set of threshold voltages and a negatively adjusted first set of threshold voltages to read the first logical page to obtain first readout information, second readout information and third readout information, respectively; selecting a second logical page of the physical page; using a second set of threshold voltage to read the second logical page to generate fourth readout information; adjusting the first set of threshold voltages to generate an adjusted first set of threshold voltages according to the first readout information, the second readout information, the third readout information and the fourth readout information; and using the adjusted first set of threshold voltages to read the first logical page of the flash memory module.

According to one embodiment of the present invention, a flash memory controller configured to access a flash memory module is disclosed. The flash memory controller comprises a read-only memory, configured to store a program code, a buffer memory and a microprocessor, configured to execute the program code to control access of the flash memory module. The microprocessor is configured to perform the steps of: using a first set of threshold voltages to read a first logical page of a physical page to generate readout information; decoding the readout information, and if the readout information is unable to be successfully decoded, using the first set of threshold voltages, a positively adjusted first set of threshold voltages and a negatively adjusted first set of threshold voltages to read the first logical page to obtain first readout information, second readout information and third readout information, respectively; selecting a second logical page of the physical page; using a second set of threshold voltage to read the second logical page to generate fourth readout information; adjusting the first set of threshold voltages to generate an adjusted first set of threshold voltages according to the first readout information, the second readout information, the third readout information and the fourth readout information; and using the adjusted first set of threshold voltages to read the first logical page of the flash memory module.

According to one embodiment of the present invention, a memory device comprising a flash memory module and a flash memory controller configured to access the flash memory module is disclosed. The flash memory controller is configured to perform the steps of: using a first set of threshold voltages to read a first logical page of a physical page to generate readout information; decoding the readout information, and if the readout information is unable to be successfully decoded, using the first set of threshold voltages, a positively adjusted first set of threshold voltages and a negatively adjusted first set of threshold voltages to read the first logical page to obtain first readout information, second readout information and third readout information, respectively; selecting a second logical page of the physical page; using a second set of threshold voltage to read the second logical page to generate fourth readout information; adjusting the first set of threshold voltages to generate an adjusted first set of threshold voltages according to the first readout information, the second readout information, the third readout information and the fourth readout information; and using the adjusted first set of threshold voltages to read the first logical page of the flash memory module.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
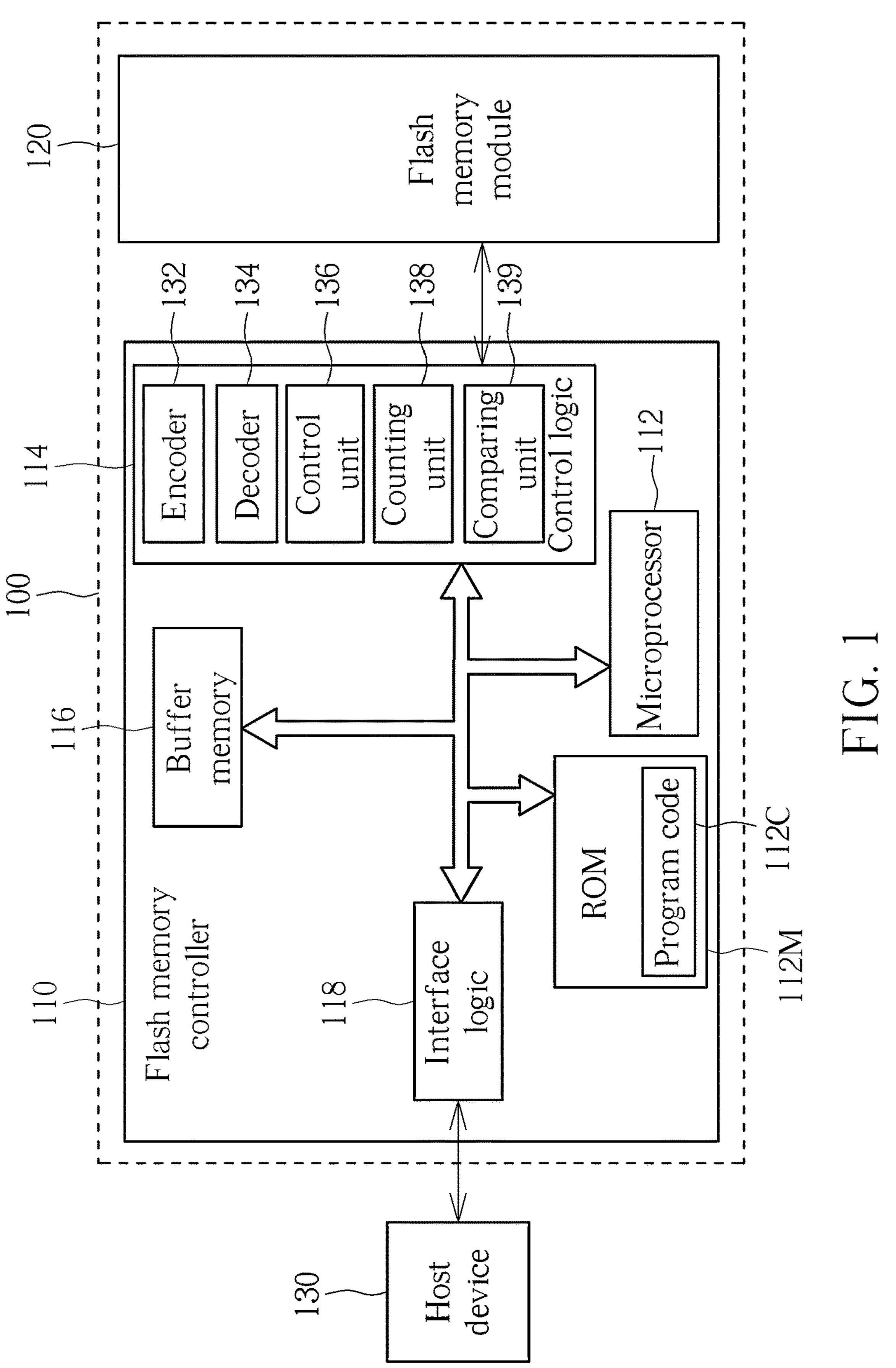
FIG. 1 is a diagram illustrating a memory device according to one embodiment of the present invention.

FIG. 1 is a diagram illustrating a memory device 100 according to one embodiment of the present invention. The memory device 100 includes a flash memory controller 110 and a flash memory module 120, and the flash memory controller 110 is arranged to access the flash memory module 120. In this embodiment, the flash memory controller 110 includes a microprocessor 112, a read only memory (ROM) 112M, a control logic 114, a buffer memory 116, and an interface logic 118. The ROM 112M is arranged to store a program code 112C. The microprocessor 112 is arranged to execute the program code 112C to control access of the flash memory module 120. The control logic 114 includes an encoder 132, a decoder 134, a control unit 136, a counting unit 138 and a comparing unit 139. The encoder 132 is arranged to encode data written into the flash memory module 120 to generate a corresponding check code (or an error correction code (ECC)). The decoder 134 is arranged to decode data read from the flash memory module 120. In addition, the control unit 136, the counting unit 138 and the comparing unit 139 are implemented by circuit components, and their specific operations will be described in subsequent embodiments.

The flash memory module 120 includes multiple flash memory chips, wherein each of the multiple flash memory chips includes a plurality of blocks, and the flash memory controller 110 may perform a copy operation, an erase operation, or a data merging operation upon the flash memory module 120 in units of blocks. In addition, a block may record a specific number of pages, wherein the flash memory controller 110 may perform a data writing operation upon the flash memory module 120 in units of pages. In other words, the smallest erase unit for the flash memory module 120 is a block, and the smallest writing unit for the flash memory module 120 is a page.

In practice, the flash memory controller 110 that executes the program code 112C through the microprocessor 112 may utilize its own internal components to perform many control operations. For example, the flash memory controller 110 may utilize the control interface 114 to control access of the flash memory module 120 (more particularly, control access of at least one block or at least one page), utilize the buffer memory 116 to perform a required buffering operation, and utilize the interface logic 118 to communicate with a host device 130.

In one embodiment, the memory device 100 may be a portable memory device such as a memory card which conforms to one of the SD/MMC, CF, MS and XD specifications, and the host device 130 is an electronic device able to be connected to the memory device 100, such as a cellphone, a laptop, a desktop computer, etc. In another embodiment, the memory device 100 may be a solid state drive (SSD) or an embedded storage device conforming to the universal flash storage (UFS) or embedded multi-media card (EMMC) specifications, and may be arranged in an electronic device. For example, the memory device 100 may be arranged in a cellphone, a watch, a portable medical testing device (e.g., a medical bracelet), a laptop, or a desktop computer. In this case, the host device 130 may be a processor of the electronic device.

In this embodiment, the flash memory module 120 is a 3D NAND-type flash memory module, wherein each block is composed of multiple word lines, multiple bit lines, and multiple memory cells. Since architecture of the 3D NAND-type flash memory module is well known to those skilled in the art, further descriptions are omitted here.

Figure 2:
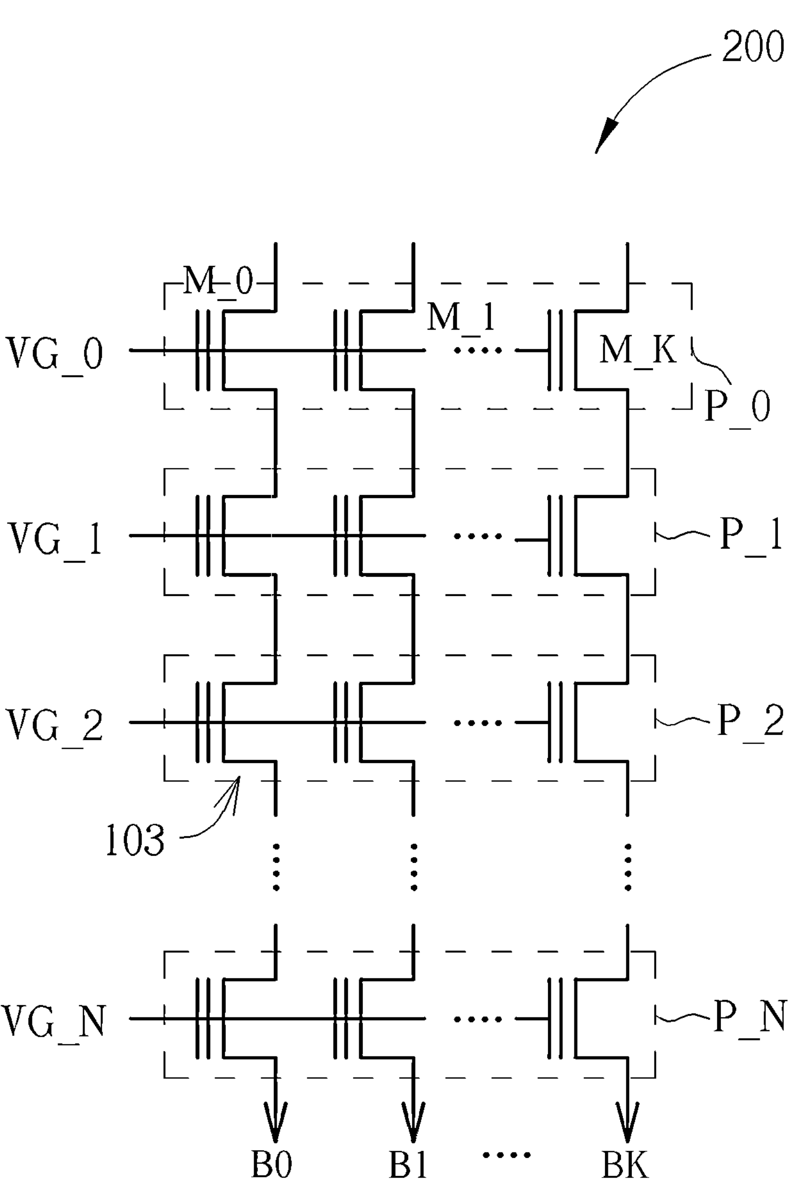
FIG. 2 is a diagram illustrating a block included in the flash memory module according to one embodiment of the present invention.

FIG. 2 is a diagram illustrating a block 200 included in the flash memory module 120 according to one embodiment of the present invention. The block 200 includes a plurality of physical pages P_0, P_1, P_2, . . . , P_N, wherein each of the physical pages P_0-P_N includes a plurality of memory cells (e.g., floating-gate transistors) 103. For example, as to a target physical page P_0 to be read, it has memory cells M_0-M_K included therein. To read the data stored in the memory cells M_0-M_K of the target physical page P_0, the control gate voltages VG_0-VG_N should be properly set to read a plurality of bits B0-BK. In a case where each of the memory cell 103 is configured to store N bits, that is the target physical page P_0 comprises N logical pages, the flash memory 102 sets the control gate voltage VG_0 to ($2^N$-1) voltage levels for identifying all of the N bits of each memory cell 103 of the target physical page P_0.

Figure 3:
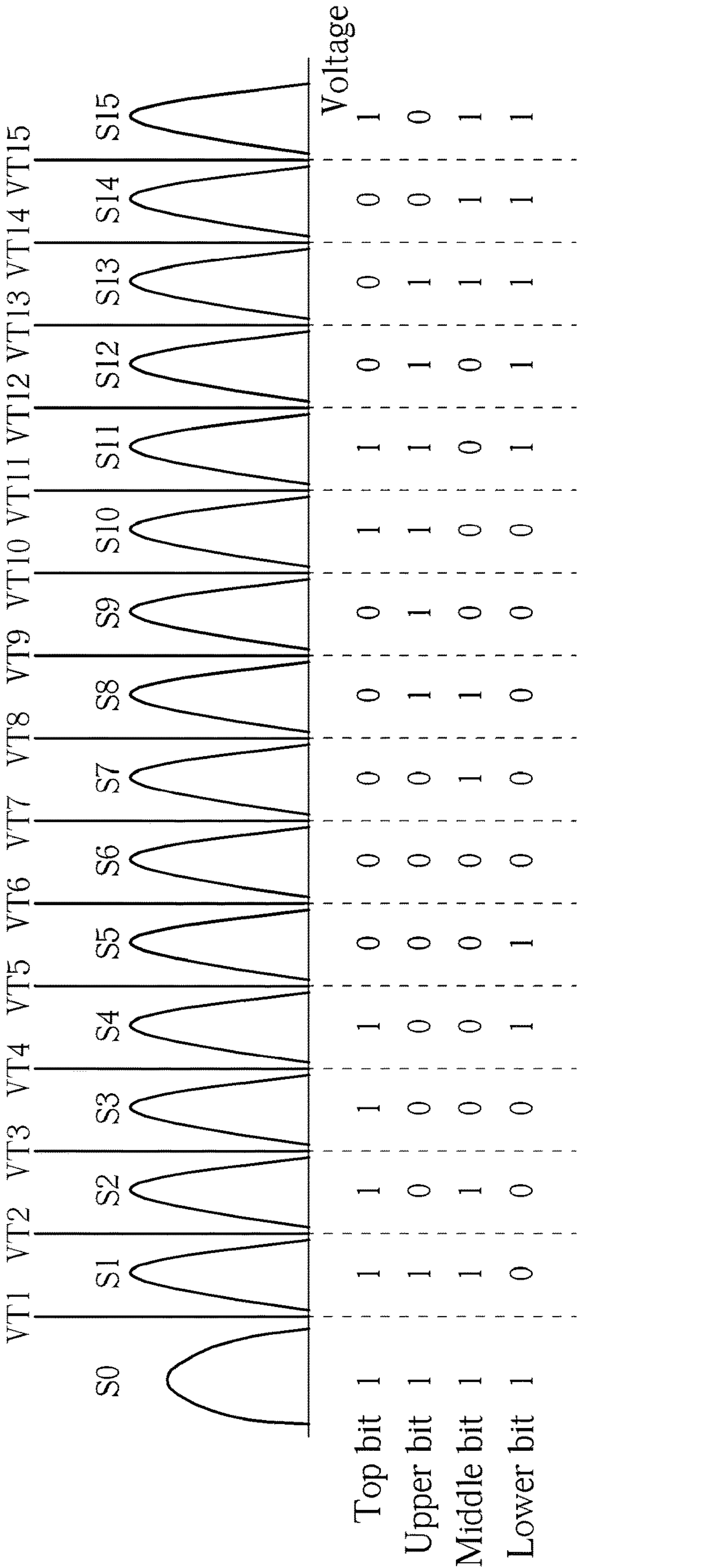
FIG. 3 is a diagram illustrating a memory unit storing four bits according to one embodiment of the present invention.

FIG. 3 is a diagram illustrating a memory unit storing four bits according to one embodiment of the present invention. As shown in FIG. 3, each memory cell can have sixteen states, and each state represents different combinations of four bits that are named as a top bit, an upper bit, a middle bit and a lower bit. In the embodiment shown in FIG. 3, when the memory cell is programmed to have the state S0, the top bit, the upper bit, the middle bit and the lower bit stored in the memory cell are (1, 1, 1, 1); when the memory cell is programmed to have the state S1, the top bit, the upper bit, the middle bit and the lower bit stored in the memory cell are (1, 1, 1, 0); when the memory cell is programmed to have the state S2, the top bit, the upper bit, the middle bit and the lower bit stored in the memory cell are (1, 0, 1, 0); when the memory cell is programmed to have the state S3, the top bit, the upper bit, the middle bit and the lower bit stored in the memory cell are (1, 0, 0, 0); when the memory cell is programmed to have the state S4, the top bit, the upper bit, the middle bit and the lower bit stored in the memory cell are (1, 0, 0, 1); when the memory cell is programmed to have the state S5, the top bit, the upper bit, the middle bit and the lower bit stored in the memory cell are (0, 0, 0, 1); when the memory cell is programmed to have the state S6, the top bit, the upper bit, the middle bit and the lower bit stored in the memory cell are (0, 0, 0, 0); when the memory cell is programmed to have the state S7, the top bit, the upper bit, the middle bit and the lower bit stored in the memory cell are (0, 0, 1, 0); when the memory cell is programmed to have the state S8, the top bit, the upper bit, the middle bit and the lower bit stored in the memory cell are (0, 1, 1, 0); when the memory cell is programmed to have the state S9, the top bit, the upper bit, the middle bit and the lower bit stored in the memory cell are (0, 1, 0, 0); when the memory cell is programmed to have the state S10, the top bit, the upper bit, the middle bit and the lower bit stored in the memory cell are (1, 1, 0, 0); when the memory cell is programmed to have the state S11, the top bit, the upper bit, the middle bit and the lower bit stored in the memory cell are (1, 1, 0, 1); when the memory cell is programmed to have the state S12, the top bit, the upper bit, the middle bit and the lower bit stored in the memory cell are (0, 1, 0, 1); when the memory cell is programmed to have the state S13, the top bit, the upper bit, the middle bit and the lower bit stored in the memory cell are (0, 1, 1, 1); when the memory cell is programmed to have the state S14, the top bit, the upper bit, the middle bit and the lower bit stored in the memory cell are (0, 0, 1, 1); and when the memory cell is programmed to have the state S15, the top bit, the upper bit, the middle bit and the lower bit stored in the memory cell are (1, 0, 1, 1).

In the relevant art, taking the page P_0 as an example, when the top bit is required to be read by the flash memory controller 110, the flash memory controller 110 can control the flash memory module 120 to apply four threshold voltages VT5, VT10, VT12 and VT15 to read the memory cell. If the memory cell is conductive when the threshold voltage VT5 is applied, the top bit is determined to be "1"; if the memory cell is not conductive when the threshold voltage VT5 is applied, and the memory cell is conductive when the threshold voltage VT10 is applied, the top bit is determined to be "0"; if the memory cell is not conductive when the threshold voltage VT10 is applied, and the memory cell is conductive when the threshold voltage VT12 is applied, the top bit is determined to be "1"; if the memory cell is not conductive when the threshold voltage VT12 is applied, and the memory cell is conductive when the threshold voltage VT15 is applied, the top bit is determined to be "0"; and if the memory cell is not conductive when the threshold voltage VT15 is applied, the top bit is determined to be "1". When the upper bit is required to be read by the flash memory controller 110, the flash memory controller 110 can control the flash memory module 120 to apply three threshold voltages VT2, VT8 and VT14 to read the memory cell. If the memory cell is conductive when the threshold voltage VT2 is applied, the upper bit is determined to be "1"; if the memory cell is not conductive when the threshold voltage VT2 is applied, and the memory cell is conductive when the threshold voltage VT8 is applied, the upper bit is determined to be "0"; if the memory cell is not conductive when the threshold voltage VT8 is applied, and the memory cell is conductive when the threshold voltage VT14 is applied, the upper bit is determined to be "0"; and if the memory cell is not conductive when the threshold voltage VT14 is applied, the upper bit is determined to be "0". When the middle bit is required to be read by the flash memory controller 110, the flash memory controller 110 can control the flash memory module 120 to apply four threshold voltages VT3, VT7, VT9 and VT13 to read the memory cell. If the memory cell is conductive when the threshold voltage VT3 is applied, the middle bit is determined to be "1"; if the memory cell is not conductive when the threshold voltage VT3 is applied, and the memory cell is conductive when the threshold voltage VT7 is applied, the middle bit is determined to be "0"; if the memory cell is not conductive when the threshold voltage VT7 is applied, and the memory cell is conductive when the threshold voltage VT9 is applied, the middle bit is determined to be "1"; if the memory cell is not conductive when the threshold voltage VT9 is applied, and the memory cell is conductive when the threshold voltage VT13 is applied, the middle bit is determined to be "0"; and if the memory cell is not conductive when the threshold voltage VT13 is applied, the middle bit is determined to be "1". When the lower bit is required to be read by the flash memory controller 110, the flash memory controller 110 can control the flash memory module 120 to apply four threshold voltages VT1, VT4, VT6 and VT11 to read the memory cell. If the memory cell is conductive when the threshold voltage VT1 is applied, the lower bit is determined to be "1"; if the memory cell is not conductive when the threshold voltage VT1 is applied, and the memory cell is conductive when the threshold voltage VT4 is applied, the lower bit is determined to be "0"; if the memory cell is not conductive when the threshold voltage VT4 is applied, and the memory cell is conductive when the threshold voltage VT6 is applied, the lower bit is determined to be "1"; if the memory cell is not conductive when the threshold voltage VT6 is applied, and the memory cell is conductive when the threshold voltage VT11 is applied, the lower bit is determined to be "0"; and if the memory cell is not conductive when the threshold voltage VT11 is applied, the lower bit is determined to be "1".

It is noted that the gray code shown in FIG. 3 is for illustratively only, and it's not a limitation of the present invention. Any suitable gray code can be used in the memory device 100, and the threshold voltages for determining the top bit, the upper bit, the middle bit and the lower bit may be changed accordingly.

Figure 4:
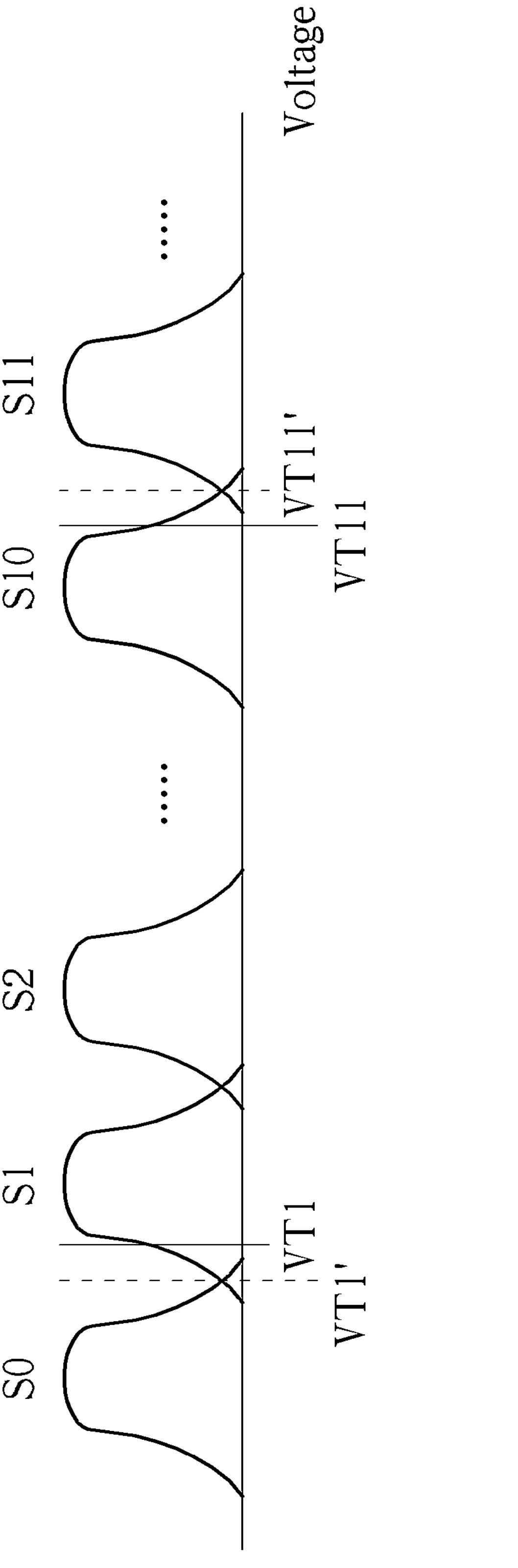
FIG. 4 is a diagram showing that the distribution of each state of the memory unit is shifted or broadened.

However, the threshold voltage distribution shown in FIG. 2 may be changed to become another threshold voltage distribution due to certain factors such as the increase of the program/erase count (P/E count) and/or the retention time. For example, the lobe-shaped distribution corresponding to each electrical charge level may be widened and/or shifted, resulting in the threshold voltage(s) used to read the memory cell is no longer the most suitable threshold voltage(s). Taking FIG. 4 as an example, due to the influence of the number of P/E count and/or data retention time of the flash memory module 120, the state S0 and the state S1 become wider and shifted to the left, and the best threshold voltage at this time should be corresponding to the intersection of the distribution of state S0 and state S1, that is, VT1' shown in FIG. 4. At this time, if the original threshold voltage VT1 is used to read the memory cell, it will make the data read from the flash memory module 120 have a higher error rate, which may cause processing problems in the decoder 134. Similarly, due to the influence of the number of P/E count and/or data retention time of the flash memory module 120, the state S10 and the state S11 become wider and shifted to the right, and the best threshold voltage at this time should be corresponding to the intersection of the distribution of state S10 and state S11, that is, VT11' shown in FIG. 4. At this time, if the original threshold voltage VT11 is used to read the memory cell, it will make the data read from the flash memory module 120 have a higher error rate, which may cause processing problems in the decoder 134. Therefore, in order to solve the above-mentioned problem of the state distribution of the memory cell being shifted and/or broadened, the present invention proposes a control method that can effectively determine the adjustment direction of the threshold voltage, especially for the bit to be read needs to use four threshold voltages. For example, as shown in FIG. 3, four threshold voltages VT1, VT4, VT6 and VT11 need to be used to obtain the lower bit of the memory cell.

Figure 5:
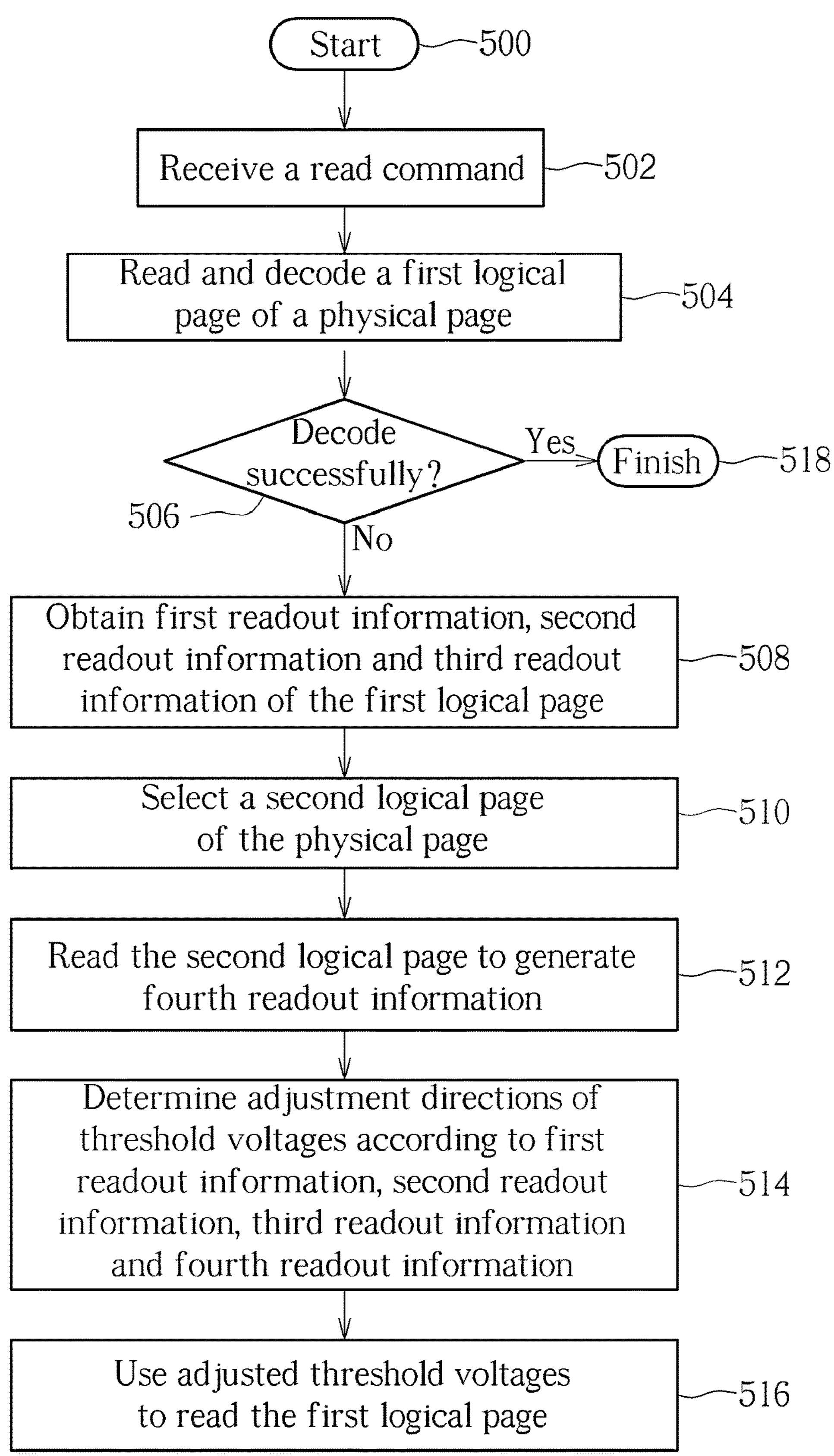
FIG. 5 is a flowchart of a method for accessing the flash memory module according to one embodiment of the present invention.

FIG. 5 is a flowchart of a method for accessing the flash memory module 120 according to one embodiment of the present invention. In Step 500, the flow starts. In Step 502, the microprocessor 112 in the flash memory controller 110 receives a read command, such as a read command from the host device 130, to start reading a first logical page of a physical page. In order to facilitate the following explanation, the physical page takes the physical page P_0 shown in FIG. 2 as an example, and each memory unit in the physical page P_0 can store four bits, that is, the physical page P_0 includes four logical pages, and the four logical pages are used to store the top bit, upper bit, middle bit and lower bit shown in FIG. 3, respectively. In addition, in the following description, the first logical page is used to store the lower bits.

In Step 504, the microprocessor 112 sends a read request to the flash memory module 120 through the control logic 114 to request to read the first logical page. After receiving the read request, the flash memory module 120 uses a first set of threshold voltages to read a section of the first logical page to obtain readout information for use by the decoder 134 of the flash memory controller 110 to perform decoding operations. In this embodiment, since the first logical page is used to store the lower bits shown in FIG. 3, the first set of threshold voltages used to read the first logical page includes the threshold voltage VT1, VT4, VT6 and VT11 shown in FIG. 3. In addition, the section in the first logical page can be a codec unit, and its size can be 4 kilo-bytes (KB) or other suitable sizes. The decoding process of this section by the decoder 134 may include a hard decoding and/or a soft decoding, where the hard decoding may be a Bose-Chaudhuri-Hocquenghem (BCH) code or a low-density parity code (LDPC) decoding method, and soft decoding can be the LDPC decoding method. Since the decoding operation of the decoder 134 is well known to those with ordinary knowledge in the art, the details of the decoding operation will not be described here.

In Step 506, the decoder 134 determines whether the readout information of the section of the first logical page is decoded successfully. If so, the flow enters Step 518 to end the read operation of the section of the first logical page; if not, the flow enters Step 508.

Figure 6:
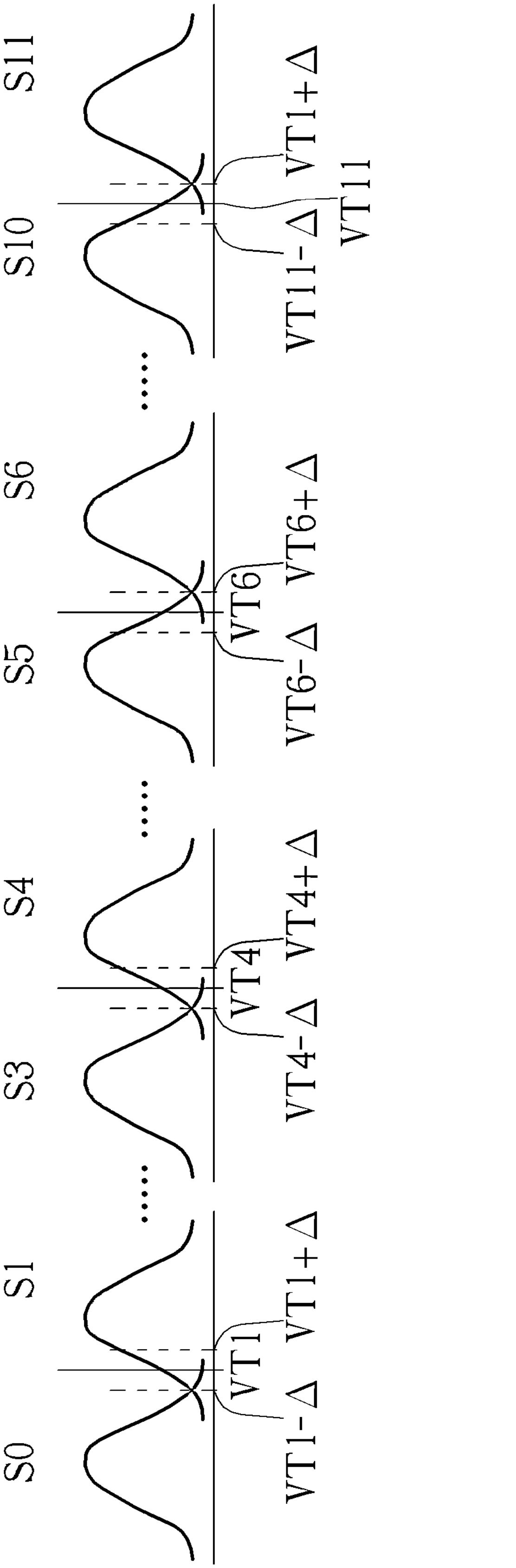
FIG. 6 is a diagram of using different threshold voltages to read the page according to one embodiment of the present invention.

In Step 508, the flash memory controller 110 obtains first readout information, second readout information and third readout information of the section of the first logical page, wherein the first readout information, the second readout information and the third readout information are obtained by the flash memory module 120 using the first set of threshold voltages, a positively adjusted first set of threshold voltages and a negatively adjusted set of threshold voltages to read the section of the first logical page, respectively. Taking FIG. 6 as an example, the control unit 136 of the flash memory controller 110 can send a first read request to the flash memory module 120 to use the first set of threshold voltages (that is threshold voltages VT1, VT4, VT6 and VT11) to read the first logical page to obtain the first readout information. Then, the control unit 136 of the flash memory controller 110 can send a second read request to the flash memory module 120 to use the positively adjusted first set of threshold voltages (that is, the threshold voltage (VT1+Δ), (VT4+Δ), (VT6+Δ) and (VT11+Δ)) to read the first logical page to obtain the second readout information, where "Δ" can be any suitable adjustment value (voltage value). Finally, the control unit 136 of the flash memory controller 110 can send a third read request to the flash memory module 120 to use the negatively adjusted first set of threshold voltages (that is, the threshold voltage (VT1−Δ), (VT4−Δ), (VT6−Δ) and (VT11−Δ)) to read the first logical page to obtain the third readout information. In this embodiment, the first readout information, the second readout information and the third readout information are temporarily stored in a buffer within the control logic 114.

In this embodiment, assuming that the size of the section of the first logical page is 4 KB (that is, 32768 bits), then each of the first readout information, the second readout information and the third readout information will also have 32768 bits.

In Step 510, the flash memory controller 110 selects a second logical page in the physical page P_0. In this embodiment, the second logical page is determined based on the first set of threshold voltages used to read the first logical page. Specifically, the two adjacent states of each threshold voltage in the first set of threshold voltages correspond to the same bit in the second logical page, and the four bits corresponding to the four threshold voltages of the first set of threshold voltages on the second logical page include two "1"s and two "0"s. In addition, the two adjacent states of the four threshold voltages included in the first set of threshold voltages include (1, 0), (0, 1), (1, 0) and (0, 1) in the first logical page, and the two sets of states (1, 0) respectively correspond to the bit "1" and bit "0" of the second logical page, and the two sets of states (0, 1) respectively correspond to the bit "1" and bit "0" of the second logical page. Taking FIG. 3 as an example, the second logical page can be used to store the upper bits in FIG. 3, wherein the two adjacent states SO and S1 of the threshold voltage VT1 in the first set of threshold voltages correspond to the same bit "1" in the second logical page, the two adjacent states S3 and S4 of the threshold voltage VT4 in the first set of threshold voltages correspond to the same bit "0" in the second logical page, the two adjacent states S5 and S6 of the threshold voltage VT6 in the first set of threshold voltages correspond to the same bit "0" in the second logical page, and the two adjacent states S10 and S11 of the threshold voltage VT11 in the first set of threshold voltages correspond to the same bit "1" in the second logical page.

In Step 512, the control unit 136 of the microprocessor 112 sends a read request to the flash memory module 120 to request to read the second logical page. After receiving the read request, the flash memory module 120 uses a second set of threshold voltages to read the section of the second logical page to obtain fourth readout information, where the fourth readout information may be undecoded data (i.e., raw data that is not decoded by the decoder 134) or decoded data that has been decoded by the decoder 134. In this embodiment, since the second logical page is used to store the upper bits in FIG. 3, the second set of threshold voltages used to read the second logical page includes the threshold voltage VT2, VT8 and VT14 shown in FIG. 3.

In addition, the section in the second logical page mentioned in Step 512 and the section in the first logical page in steps 504 and 508 correspond to the same memory units.

In this embodiment, the fourth readout information of the section of the second logical page has the same size as the above-mentioned first readout information, second readout information and third readout information. That is, assuming that the size of the section of the first logical page is 32768 bits, then each of the fourth readout information of the section of the second logical page, the first readout information, the second readout information and the third readout information of the first logical page will also have 32768 bits.

In addition, in this embodiment, it is assumed that the section of the second logical page can be successfully decoded. If the section of the second logical page cannot be successfully decoded, other suitable decoding methods can be used, such as redundant array of independent disks (RAID) decoding method, to obtain the fourth readout information.

In Step 514, the control logic 114 determines adjustment directions of the four threshold voltages in the first set of threshold voltages according to the fourth readout information of the section of the second logical page, the first readout information, the second readout information and the third readout information of the first logical page, to determine an adjusted first set of threshold voltages.

Figure 7:
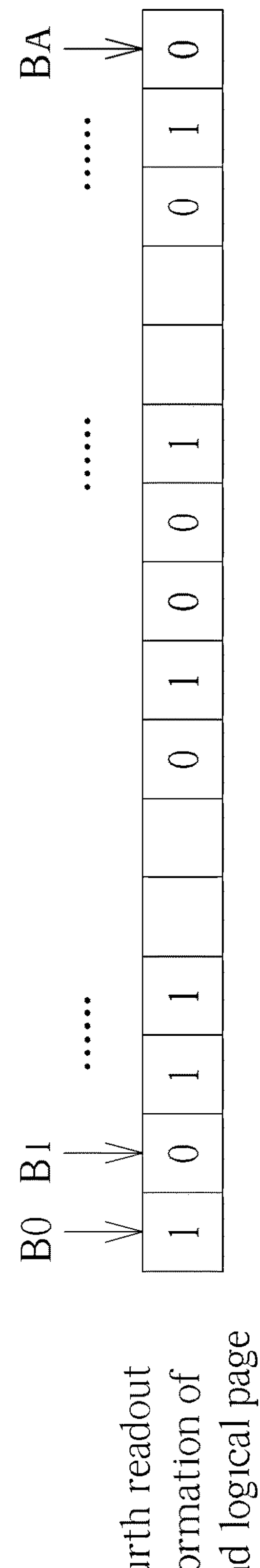
FIG. 7 is a diagram of determining that the second readout information has bit flipping relative to the first readout information, and that the third readout information has bit flipping relative to the first readout information.
Figure 7:
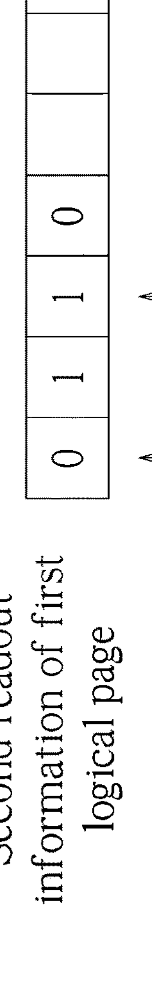
Figure 7:
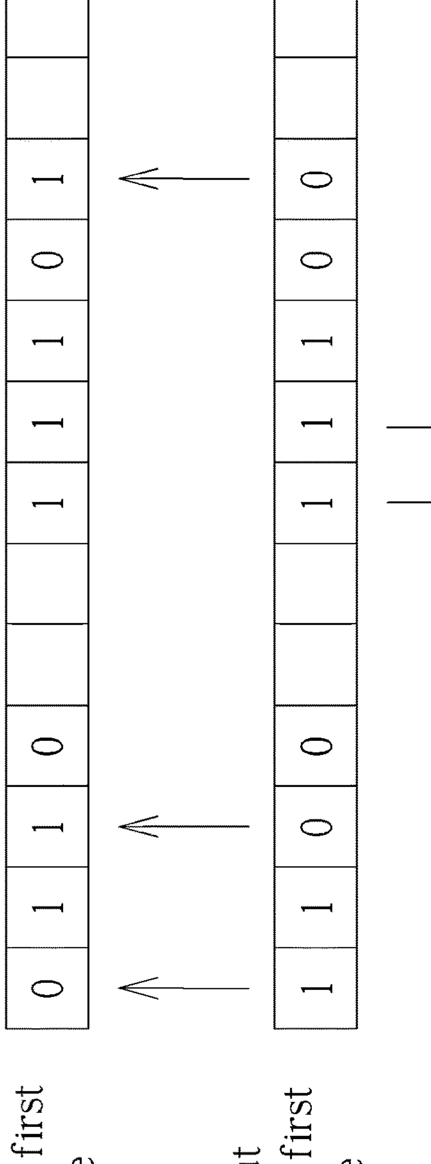
Figure 7:
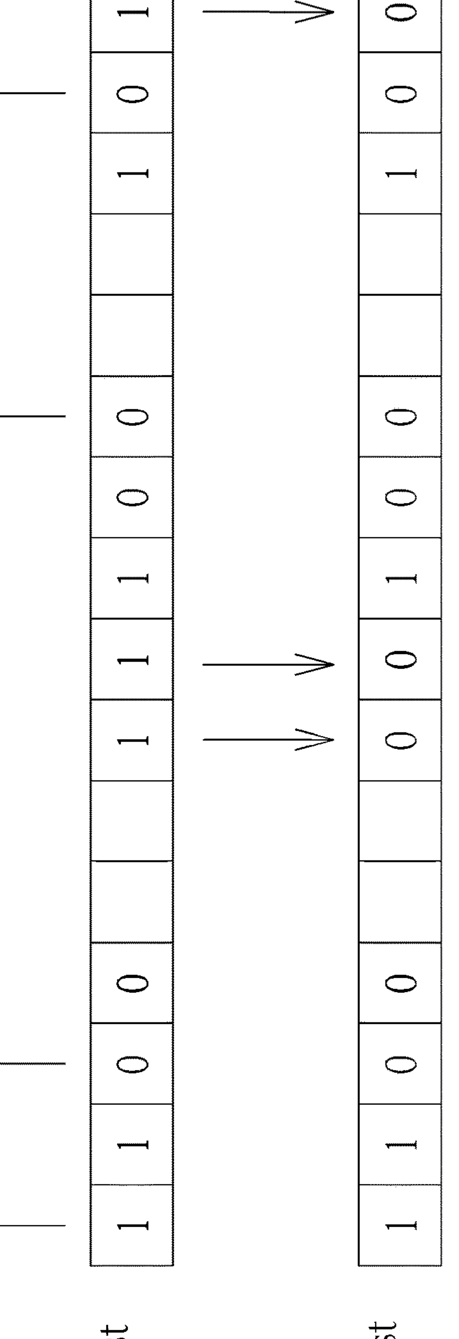

Specifically, referring to FIG. 7, the fourth readout information of the second logical page, the first readout information, the second readout information and the third readout information of the first logical page are obtained by reading the memory units M_0-M_A of the physical page P_0 shown in FIG. 2 at different times, where "A" can be "32767" in this embodiment. In detail, firstly, for the fourth readout information of the second logical page is equal to a first logical value (for example, "1"), the comparing unit 139 compares the first readout information with the second readout information of the first logical page, and the counting unit 138 then calculates the number of first bit flipping and the number of second bit flipping in the second readout information relative to the first readout information. In this embodiment, the first bit flipping can be from "1" to "0", that is, the bit read out by a memory unit is "1" in the first readout information, but the bit read out by the same memory unit is "0" in the second readout information. The second bit flipping can be from "0" to "1", that is, the bit read out by a memory unit is "0" in the first readout information, but the bit read out by the same memory unit is "1" in the second readout information. Then, for the fourth readout information of the second logical page is equal to a second logical value (for example, "0"), the comparing unit 139 compares the first readout information and the second readout information of the first logical page, and the counting unit 138 then calculates the number of first bit flipping and the number of second bit flipping in the second readout information relative to the first readout information.

Then, for the fourth readout information of the second logical page is equal to a first logical value (for example, "1"), the comparing unit 139 compares the first readout information with the third readout information of the first logical page, and the counting unit 138 then calculates the number of first bit flipping and the number of second bit flipping in the third readout information relative to the first readout information. In this embodiment, the first bit flipping can be from "1" to "0", that is, the bit read out by a memory unit is "1" in the first readout information, but the bit read out by the same memory unit is "0" in the third readout information. The second bit flipping can be from "0" to "1", that is, the bit read out by a memory unit is "0" in the first readout information, but the bit read out by the same memory unit is "1" in the third readout information. Finally, for the fourth readout information of the second logical page is equal to a second logical value (for example, "0"), the comparing unit 139 compares the first readout information and the third readout information of the first logical page, and the counting unit 138 then calculates the number of first bit flipping and the number of second bit flipping in the third readout information relative to the first readout information.

In this embodiment, eight counter values are obtained by using the above calculation, that is the number of first bit flipping and the number of second bit flipping in the second readout information relative to the first readout information for the fourth readout information of the second logical page is equal to the first logical value "1", the number of first bit flipping and the number of second bit flipping in the second readout information relative to the first readout information for the fourth readout information of the second logical page is equal to the first logical value "0", the number of first bit flipping and the number of second bit flipping in the third readout information relative to the first readout information for the fourth readout information of the second logical page is equal to the first logical value "1", and the number of first bit flipping and the number of second bit flipping in the third readout information relative to the first readout information for the fourth readout information of the second logical page is equal to the first logical value "0". These eight counter values can be used to correctly determine the adjustment directions of the four threshold voltages VT1, VT4, VT6 and VT11 in the first set of threshold voltages.

For example, assuming that the number of second bit flipping (i.e., from "0" to "1") in the second readout information relative to the first readout information is "N1", and the number of first bit flipping (i.e., from "1" to "0") in the third readout information relative to the first readout information is "N2" for the fourth readout information of the second logical page is equal to the first logical value "1", if N1 is greater than N2, it means that the number of new "1"s added after using the threshold voltage (VT1+Δ) to read the first logical page will be greater than the number of new "0"s added after using the threshold voltage (VT1−Δ) to read the first logical page. Therefore, the intersection of the distribution of state S0 and state S1 should be located on the left side of threshold voltage VT1, that is, threshold voltage VT1 should be decreased to obtain a better adjusted threshold voltage VT1'. Similarly, if N1 is less than N2, it means that the number of new "1"s added after using the threshold voltage (VT1+Δ) to read the first logical page will be less than the number of new "0"s added after using the threshold voltage (VT1−Δ) to read the first logical page. Therefore, the intersection of the distribution of state S0 and state S1 should be located on the right side of threshold voltage VT1, that is, threshold voltage VT1 should be increased to obtain a better adjusted threshold voltage VT1'.

Assuming that the number of first bit flipping (i.e., from "1" to "0") in the second readout information relative to the first readout information is "N3", and the number of second bit flipping (i.e., from "0" to "1") in the third readout information relative to the first readout information is "N4" for the fourth readout information of the second logical page is equal to the first logical value "1", if N3 is greater than N4, it means that the number of new "0"s added after using the threshold voltage (VT11+Δ) to read the first logical page will be greater than the number of new "1"s added after using the threshold voltage (VT11−Δ) to read the first logical page. Therefore, the intersection of the distribution of state S10 and state S11 should be located on the left side of threshold voltage VT11, that is, threshold voltage VT11 should be decreased to obtain a better adjusted threshold voltage VT11'. Similarly, if N3 is less than N4, it means that the number of new "0"s added after using the threshold voltage (VT11+Δ) to read the first logical page will be less than the number of new "1"s added after using the threshold voltage (VT11−Δ) to read the first logical page. Therefore, the intersection of the distribution of state S10 and state S11 should be located on the right side of threshold voltage VT11, that is, threshold voltage VT11 should be increased to obtain a better adjusted threshold voltage VT11'.

Assuming that the number of first bit flipping (i.e., from "1" to "0") in the second readout information relative to the first readout information is "N5", and the number of second bit flipping (i.e., from "0" to "1") in the third readout information relative to the first readout information is "N6" for the fourth readout information of the second logical page is equal to the second logical value "0", if N5 is greater than N6, it means that the number of new "0"s added after using the threshold voltage (VT4+Δ) to read the first logical page will be greater than the number of new "1"s added after using the threshold voltage (VT4−Δ) to read the first logical page. Therefore, the intersection of the distribution of state S3 and state S4 should be located on the left side of threshold voltage VT4, that is, threshold voltage VT4 should be decreased to obtain a better adjusted threshold voltage VT4'. Similarly, if N5 is less than N6, it means that the number of new "0"s added after using the threshold voltage (VT4+Δ) to read the first logical page will be less than the number of new "1"s added after using the threshold voltage (VT4−Δ) to read the first logical page. Therefore, the intersection of the distribution of state S3 and state S4 should be located on the right side of threshold voltage VT4, that is, threshold voltage VT4 should be increased to obtain a better adjusted threshold voltage VT4'.

Assuming that the number of second bit flipping (i.e., from "0" to "1") in the second readout information relative to the first readout information is "N7", and the number of first bit flipping (i.e., from "1" to "0") in the third readout information relative to the first readout information is "N8" for the fourth readout information of the second logical page is equal to the second logical value "0", if N7 is greater than N8, it means that the number of new "1"s added after using the threshold voltage (VT6+Δ) to read the first logical page will be greater than the number of new "0"s added after using the threshold voltage (VT6−Δ) to read the first logical page. Therefore, the intersection of the distribution of state S5 and state S6 should be located on the left side of threshold voltage VT6, that is, threshold voltage VT6 should be decreased to obtain a better adjusted threshold voltage VT6'. Similarly, if N7 is less than N8, it means that the number of new "1"s added after using the threshold voltage (VT6+Δ) to read the first logical page will be less than the number of new "0"s added after using the threshold voltage (VT6−Δ) to read the first logical page. Therefore, the intersection of the distribution of state S5 and state S6 should be located on the right side of threshold voltage VT6, that is, threshold voltage VT6 should be increased to obtain a better adjusted threshold voltage VT6'.

As mentioned above, after determining the adjustment directions of the four threshold voltages VT1, VT4, VT6 and VT11, the control unit 136 can determine the adjusted first set of threshold voltages. Taking FIG. 6 as an example, the adjusted first set of threshold voltages includes (VT1−Δ), (VT4−Δ), (VT6+Δ) and (VT11+Δ).

In Step 516, the microprocessor 112 sends a read request to the flash memory module 120 through the control logic 114 to request to read the first logical page again, and controls the flash memory module 120 to use the adjusted first set of threshold voltages to read the section of the first logical page to obtain readout information for the decoder 134 of the flash memory controller 110 to perform a decoding operation.

In the above embodiment, when the first logical page cannot be successfully decoded, the second logical page and the first logical page can be read for adjusting the first set of threshold voltages to generate the adjusted first set of threshold voltages. Then, the first logical page is read again by using the adjusted first set of threshold voltages to greatly increase the probability of successful reading/decoding.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for accessing a flash memory module, comprising:

using a first set of threshold voltages to read a first logical page of a physical page to generate readout information;

decoding the readout information, and if the readout information is unable to be successfully decoded, using the first set of threshold voltages, a positively adjusted first set of threshold voltages and a negatively adjusted first set of threshold voltages to read the first logical page to obtain first readout information, second readout information and third readout information, respectively;

selecting a second logical page of the physical page;

using a second set of threshold voltage to read the second logical page to generate fourth readout information;

adjusting the first set of threshold voltages to generate an adjusted first set of threshold voltages according to the first readout information, the second readout information, the third readout information and the fourth readout information; and using the adjusted first set of threshold voltages to read the first logical page of the flash memory module.

2. The method of claim 1, wherein the first set of threshold voltages comprises a first threshold voltage, a second threshold voltage, a third threshold voltage and a fourth threshold voltage; the positively adjusted first set of threshold voltages comprises the first threshold voltage plus an adjustment value, the second threshold voltage plus the adjustment value, the third threshold voltage plus the adjustment value, and the fourth threshold voltage plus the adjustment value; and the negatively adjusted first set of threshold voltages comprises the first threshold voltage minus the adjustment value, the second threshold voltage minus the adjustment value, the third threshold voltage minus the adjustment value, and the fourth threshold voltage minus the adjustment value.

3. The method of claim 1, wherein the physical page comprises a plurality of memory units, each memory unit is used to store a plurality of bits, each memory unit supports a plurality of states, and the plurality of states are used to represent different combinations of the plurality of bits; and two adjacent states of each threshold voltage in the first set of threshold voltages correspond to the same bit in the second logical page.

4. The method of claim 3, wherein each memory unit is used to store four bits, each memory unit supports sixteen states; and four bits corresponding to a first threshold voltage, a second threshold voltage, a third threshold voltage and a fourth threshold voltage of the first set of threshold voltages on the second logical page comprise two “1”s and two “0”s; and the two adjacent states of the first threshold voltage, the second threshold voltage, the third threshold voltage and the fourth threshold voltage comprises (1, 0), (0, 1), (1, 0) and (0, 1) in the first logical page, and two sets of states (1, 0) respectively correspond to bit “1” and bit “0” of the second logical page, and the two sets of states (0, 1) respectively correspond to bit “1” and bit “0” of the second logical page.

5. The method of claim 4, wherein the step of adjusting the first set of threshold voltages to generate the adjusted first set of threshold voltages according to the first readout information, the second readout information, the third readout information and the fourth readout information comprises:

for the fourth readout information is equal to a first logical value, comparing the first readout information and the second readout information of the first logical page, and counting a number of first bit flipping and a number of second bit flipping in the second readout information relative to the first readout information, to obtain a first counter value and a second counter value;

for the fourth readout information is equal to a second logical value, comparing the first readout information and the second readout information of the first logical page, and counting a number of first bit flipping and a number of second bit flipping in the second readout information relative to the first readout information, to obtain a third counter value and a fourth counter value;

for the fourth readout information is equal to the first logical value, comparing the first readout information and the third readout information of the first logical page, and counting a number of first bit flipping and a number of second bit flipping in the third readout information relative to the first readout information, to obtain a fifth counter value and a sixth counter value;

for the fourth readout information is equal to the second logical value, comparing the first readout information and the third readout information of the first logical page, and counting a number of first bit flipping and a number of second bit flipping in the third readout information relative to the first readout information, to obtain a seventh counter value and an eighth counter value; and determining adjustment directions of the first threshold voltage, the second threshold voltage, the third threshold voltage and the fourth threshold voltage according to the first counter value, the second counter value, the third counter value, the fourth counter value, the fifth counter value, the sixth counter value, the seventh counter value and the eighth counter value, to generate the adjusted first set of threshold voltages.

6. A flash memory controller, wherein the flash memory controller is configured to access a flash memory module, and the flash memory controller comprises:

a read-only memory, configured to store a program code;

a buffer memory; and a microprocessor, configured to execute the program code to control access of the flash memory module;

wherein the microprocessor is configured to perform the steps of:

using a first set of threshold voltages to read a first logical page of a physical page to generate readout information;

decoding the readout information, and if the readout information is unable to be successfully decoded, using the first set of threshold voltages, a positively adjusted first set of threshold voltages and a negatively adjusted first set of threshold voltages to read the first logical page to obtain first readout information, second readout information and third readout information, respectively;

selecting a second logical page of the physical page;

using a second set of threshold voltage to read the second logical page to generate fourth readout information;

adjusting the first set of threshold voltages to generate an adjusted first set of threshold voltages according to the first readout information, the second readout information, the third readout information and the fourth readout information; and using the adjusted first set of threshold voltages to read the first logical page of the flash memory module.

7. The flash memory controller of claim 6, wherein the first set of threshold voltages comprises a first threshold voltage, a second threshold voltage, a third threshold voltage and a fourth threshold voltage; the positively adjusted first set of threshold voltages comprises the first threshold voltage plus an adjustment value, the second threshold voltage plus the adjustment value, the third threshold voltage plus the adjustment value, and the fourth threshold voltage plus the adjustment value; and the negatively adjusted first set of threshold voltages comprises the first threshold voltage minus the adjustment value, the second threshold voltage minus the adjustment value, the third threshold voltage minus the adjustment value, and the fourth threshold voltage minus the adjustment value.

8. The flash memory controller of claim 6, wherein the physical page comprises a plurality of memory units, each memory unit is used to store a plurality of bits, each memory unit supports a plurality of states, and the plurality of states are used to represent different combinations of the plurality of bits; and two adjacent states of each threshold voltage in the first set of threshold voltages correspond to the same bit in the second logical page.

9. The flash memory controller of claim 8, wherein each memory unit is used to store four bits, each memory unit supports sixteen states; and four bits corresponding to a first threshold voltage, a second threshold voltage, a third threshold voltage and a fourth threshold voltage of the first set of threshold voltages on the second logical page comprise two “1”s and two “0”s; and the two adjacent states of the first threshold voltage, the second threshold voltage, the third threshold voltage and the fourth threshold voltage comprises (1, 0), (0, 1), (1, 0) and (0, 1) in the first logical page, and two sets of states (1, 0) respectively correspond to bit “1”

and bit "0" of the second logical page, and the two sets of states (0, 1) respectively correspond to bit "1" and bit "0" of the second logical page.

10. The flash memory controller of claim 9, wherein the step of adjusting the first set of threshold voltages to generate the adjusted first set of threshold voltages according to the first readout information, the second readout information, the third readout information and the fourth readout information comprises:

for the fourth readout information is equal to a first logical value, comparing the first readout information and the second readout information of the first logical page, and counting a number of first bit flipping and a number of second bit flipping in the second readout information relative to the first readout information, to obtain a first counter value and a second counter value;

for the fourth readout information is equal to a second logical value, comparing the first readout information and the second readout information of the first logical page, and counting a number of first bit flipping and a number of second bit flipping in the second readout information relative to the first readout information, to obtain a third counter value and a fourth counter value;

for the fourth readout information is equal to the first logical value, comparing the first readout information and the third readout information of the first logical page, and counting a number of first bit flipping and a number of second bit flipping in the third readout information relative to the first readout information, to obtain a fifth counter value and a sixth counter value;

for the fourth readout information is equal to the second logical value, comparing the first readout information and the third readout information of the first logical page, and counting a number of first bit flipping and a number of second bit flipping in the third readout information relative to the first readout information, to obtain a seventh counter value and an eighth counter value; and determining adjustment directions of the first threshold voltage, the second threshold voltage, the third threshold voltage and the fourth threshold voltage according to the first counter value, the second counter value, the third counter value, the fourth counter value, the fifth counter value, the sixth counter value, the seventh counter value and the eighth counter value, to generate the adjusted first set of threshold voltages.

11. A memory device, comprising:

a flash memory module; and a flash memory controller, configured to access the flash memory module;

wherein the flash memory controller is configured to perform the steps of:

using a first set of threshold voltages to read a first logical page of a physical page to generate readout information;

decoding the readout information, and if the readout information is unable to be successfully decoded, using the first set of threshold voltages, a positively adjusted first set of threshold voltages and a negatively adjusted first set of threshold voltages to read the first logical page to obtain first readout information, second readout information and third readout information, respectively;

selecting a second logical page of the physical page;

using a second set of threshold voltage to read the second logical page to generate fourth readout information;

adjusting the first set of threshold voltages to generate an adjusted first set of threshold voltages according to the first readout information, the second readout information, the third readout information and the fourth readout information; and using the adjusted first set of threshold voltages to read the first logical page of the flash memory module.

12. The memory device of claim 11, wherein the first set of threshold voltages comprises a first threshold voltage, a second threshold voltage, a third threshold voltage and a fourth threshold voltage; the positively adjusted first set of threshold voltages comprises the first threshold voltage plus an adjustment value, the second threshold voltage plus the adjustment value, the third threshold voltage plus the adjustment value, and the fourth threshold voltage plus the adjustment value; and the negatively adjusted first set of threshold voltages comprises the first threshold voltage minus the adjustment value, the second threshold voltage minus the adjustment value, the third threshold voltage minus the adjustment value, and the fourth threshold voltage minus the adjustment value.

13. The memory device of claim 11, wherein the physical page comprises a plurality of memory units, each memory unit is used to store a plurality of bits, each memory unit supports a plurality of states, and the plurality of states are used to represent different combinations of the plurality of bits; and two adjacent states of each threshold voltage in the first set of threshold voltages correspond to the same bit in the second logical page.

14. The memory device of claim 13, wherein each memory unit is used to store four bits, each memory unit supports sixteen states; and four bits corresponding to a first threshold voltage, a second threshold voltage, a third threshold voltage and a fourth threshold voltage of the first set of threshold voltages on the second logical page comprise two "1"s and two "0"s; and the two adjacent states of the first threshold voltage, the second threshold voltage, the third threshold voltage and the fourth threshold voltage comprises (1, 0), (0, 1), (1, 0) and (0, 1) in the first logical page, and two sets of states (1, 0) respectively correspond to bit "1" and bit "0" of the second logical page, and the two sets of states (0, 1) respectively correspond to bit "1" and bit "0" of the second logical page.

15. The memory device of claim 14, wherein the step of adjusting the first set of threshold voltages to generate the adjusted first set of threshold voltages according to the first readout information, the second readout information, the third readout information and the fourth readout information comprises:

for the fourth readout information is equal to a first logical value, comparing the first readout information and the second readout information of the first logical page, and counting a number of first bit flipping and a number of second bit flipping in the second readout information relative to the first readout information, to obtain a first counter value and a second counter value;

for the fourth readout information is equal to a second logical value, comparing the first readout information and the second readout information of the first logical page, and counting a number of first bit flipping and a number of second bit flipping in the second readout information relative to the first readout information, to obtain a third counter value and a fourth counter value;

for the fourth readout information is equal to the first logical value, comparing the first readout information and the third readout information of the first logical page, and counting a number of first bit flipping and a number of second bit flipping in the third readout information relative to the first readout information, to obtain a fifth counter value and a sixth counter value;

for the fourth readout information is equal to the second logical value, comparing the first readout information and the third readout information of the first logical page, and counting a number of first bit flipping and a number of second bit flipping in the third readout information relative to the first readout information, to obtain a seventh counter value and an eighth counter value; and determining adjustment directions of the first threshold voltage, the second threshold voltage, the third threshold voltage and the fourth threshold voltage according to the first counter value, the second counter value, the third counter value, the fourth counter value, the fifth counter value, the sixth counter value, the seventh counter value and the eighth counter value, to generate the adjusted first set of threshold voltages.

* * * * *